(12) United States Patent
Held et al.

(10) Patent No.: US 11,187,736 B2
(45) Date of Patent: Nov. 30, 2021

(54) METHOD OF SETTING AN ANALYZER FOR TESTING A DEVICE UNDER TEST

(71) Applicant: Rohde & Schwarz GmbH & Co. KG, Munich (DE)

(72) Inventors: Werner Held, Munich (DE); Jan-Patrick Schultheis, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 44 days.

(21) Appl. No.: 16/796,634

(22) Filed: Feb. 20, 2020

(65) Prior Publication Data

US 2021/0263088 A1 Aug. 26, 2021

(51) Int. Cl.
*G01R 27/28* (2006.01)

(52) U.S. Cl.
CPC .................. *G01R 27/28* (2013.01)

(58) Field of Classification Search
CPC .. G01R 27/28; G01R 35/005; G01R 31/2822; G01R 31/3191; G01R 27/32; G01R 31/2837; H04B 17/21
See application file for complete search history.

(56) References Cited

U.S. PATENT DOCUMENTS

| 6,636,816 B1* | 10/2003 | Dvorak | G01R 27/28 324/76.41 |
| 7,089,158 B2* | 8/2006 | Sternberg | G01R 27/28 324/613 |
| 2009/0184721 A1* | 7/2009 | Albert-Lebrun | G01R 27/32 324/601 |
| 2011/0025296 A1* | 2/2011 | Benedikt | G01R 31/2837 324/76.19 |

* cited by examiner

*Primary Examiner* — Akm Zakaria
(74) *Attorney, Agent, or Firm* — Christensen O'Connor Johnson Kindness PLLC

(57) ABSTRACT

A method of setting an analyzer, the method comprising: providing an analyzer with a first signal source and a second signal source; connecting the signal sources with a device under test; generating a first signal, transmitting the first signal to the device under test, measuring the first transmitted signal and a first signal reflected from the device under test, thereby obtaining first compensation parameters; generating a second signal, transmitting the second signal to the device under test, measuring the second transmitted signal and a second signal reflected from the device under test, thereby obtaining second compensation parameters; using the first and second compensation parameters to compensate the signal sources; and transmitting the first and second signals simultaneously.

23 Claims, 3 Drawing Sheets

METHOD OF SETTING AN ANALYZER FOR TESTING A DEVICE UNDER TEST

TECHNICAL FIELD

Embodiments of the present disclosure relate generally to a method of setting an analyzer for testing a device under test.

BACKGROUND

Different types of measurements performed on certain devices under test require that several signals be generated with precisely defined amplitude and phase. For instance, this is necessary for true differential measurements, phased array measurements and measurements on an I/Q mixer by an analyzer.

It is known to provide several signals that have a defined relative phase as well as a defined relative amplitude, for instance by splitting a signal generated into several signals used for testing the device under test.

It is further known in the state of the art to perform measurements via several individual ports of an analyzer, which provides a respective signal at each port separately in an iterative manner. Then, phase and/or amplitude of a respective source associated with the individual port are/is corrected to fit the desired value(s). However, this approach only results in signal sources having precisely defined amplitude and phase when operated solely.

Accordingly, operating two signal sources simultaneously to provide two signals at two different ports at the same time will result in signals influencing each other. This is based on the fact that a respective signal is transferred from a corresponding port through the device under test to the other port associated with the other signal source. Accordingly, the pre-measurements performed in order to correct their respective signal sources are not applicable anymore or rather they do not provide precise correction. Consequently, amplitude and phase at the respective ports are not precise anymore. The same is true for the respective amplitude difference and/or phase difference. To overcome this, the amplitude difference and/or the phase difference are optimized in the state of the art, which however still results in wrong values of the absolute phase and/or the absolute amplitude.

SUMMARY

Accordingly, there is a need for a method that ensures precise setting of an analyzer with regard to amplitude and/or phase for testing a device under test precisely.

Embodiments of the present disclosure provide a method of setting an analyzer for testing a device under test. In an embodiment, the method comprises the steps of:

providing an analyzer with at least a first signal source and a second signal source, wherein each signal source is capable of being set in absolute phase and/or absolute amplitude, connecting the signal sources with a device under test, generating a first signal by of the first signal source, wherein the first signal is transmitted to the device under test, and wherein the first transmitted signal is measured in amplitude and phase and a first signal reflected from the device under test is measured in amplitude and phase, thereby obtaining first compensation parameters for the first signal source, generating a second signal by the second signal source, wherein the second signal is transmitted to the device under test, and wherein the second transmitted signal is measured in amplitude and phase and a second signal reflected from the device under test is measured in amplitude and phase, thereby obtaining second compensation parameters for the second signal source, using the first compensation parameters and the second compensation parameters to compensate the signal sources with regard to absolute phase and/or absolute amplitude, and transmitting the first signal by the first signal source and the second signal by the second signal source simultaneously.

Accordingly, the absolute phase and the absolute amplitude are ensured for the signals generated by the analyzer while performing the method according to the present disclosure. Therefore, several signals with precisely defined amplitude and phase can be provided at the same time of the analyzer such that the respective device under test can be tested appropriately. Hence, true differential measurements, phased array measurements and/or measurements of I/Q mixers can be performed accordingly by the analyzer after it was set.

Since the absolute phase and the absolute amplitude are ensured, any required relative property can be generated. Thus, no redesign of external electrical components is required in order to determine the respective relative property if needed.

In other words, pre-measurements are performed in order to obtain the respective compensation parameters that are used to correct the respective signal sources for an accurate phase and/or amplitude, namely the absolute phase and/or the absolute amplitude. The respective compensation parameters are determined while all signal sources of the analyzer are connected with the device under test, which means they are intended for the simultaneous transmission later. Accordingly, these signal sources are used simultaneously for the respective measurement of the device under test afterwards.

According to an aspect, settings of the signal sources are adjusted while connected to the device under test to compensate a port mismatch. The individual signal sources are not corrected individually while only the respective signal source is connected with the device under test, which would result in port mismatch when several signal sources are operated simultaneously afterwards.

According to another aspect, the signal sources transmit their respective signals at the same frequency. Hence, respective measurements of the device under test can be performed, which require at least two different signals with the same frequency.

Further, the signal sources are synchronized in time with respect to each other. The respective signal sources, for example direct digital synthesizers (DDS) assigned thereto, are started at exactly the same time. Thus, all signal sources or rather the respective direct digital synthesizers start working at the exact same time, which causes them to generate respective signals with the same phase at any time.

Any differences in phase result from the respective signal paths between the signal sources and the device under test, which however are compensated by the compensation parameters determined previously.

A further aspect provides that the second signal source is connected with the device under test when the first signal source transmits the first signal. Additionally or alternatively, the first signal source is connected with the device under test when the second signal source transmits the second signal. Accordingly, the respective signal sources are always connected with the device under test even though they are not transmitting a respective signal to the device under test. This ensures that the respective signal sources are operated in a phase-stable manner. In other words, the connections established are maintained during the respective pre-measurements.

According to another aspect, the second signal is reduced in power when the first signal source transmits the first signal. Additionally or alternatively, the first signal is reduced in power when the second signal source transmits the second signal. Thus, the respective signal sources not transmitting a signal to the device under test are reduced in power in such a manner that increasing the power again results in the same phase as before. For instance, the power of the first signal source is reduced when the second signal source transmits the second signal to the device under test, whereas the power is increased again when both signal sources transmit their respective signals simultaneously.

Moreover, the increasing of the respective power may yield the same power as before provided that the power is increased to the same level as before.

A further aspect provides that the second signal source is active, but attenuated when the first signal is generated and transmitted by the first signal source. Additionally or alternatively, the first signal source is active, but attenuated when the second signal is generated and transmitted by the second signal source. A respective attenuation, for instance a switchable attenuation, takes place in order to ensure that the first signal or rather the second signal is transmitted solely in order to determine the respective compensation parameters used for correcting the signal sources in an appropriate manner.

In some embodiments, the absolute phase and/or the absolute amplitude are/is independent of an isolation of the device under test. Hence, the measurement result is still valid even if the isolation of the device under test is poor.

Another aspect provides that the analyzer comprises three or more signal sources, wherein each of the signal sources transmits a respective signal to the device under test. The respective transmitted signal is measured in amplitude and phase and a respective signal reflected from the device under test is measured in amplitude and phase, thereby obtaining respective compensation parameters for the respective signal source. The process mentioned above for absolute phase and absolute amplitude compensation may be applied to any number of signal sources or rather signals. In some embodiments, the respective signal sources follow the same procedure mentioned above in order to obtain the corresponding compensation parameters.

In some embodiments, all signal sources transmit their respective signals simultaneously after respective compensation parameters were obtained for all signal sources involved in the simultaneous transmission. Hence, all signal sources are used in a pre-measurement previously in order to determine the respective compensation parameters for that signal source. Once all compensation parameters have been obtained, all signal sources may be controlled such that they transmit their respective signals simultaneously in order to perform the intended measurement on the device under test.

Further, an amplitude calibration and/or a phase calibration may be performed at a calibration plane. The respective calibration may be performed when measuring the respective transmitted signal and/or the respective reflected signal. The calibrations determine the position of the amplitudes and planes, namely the respective calibration plane.

In some embodiments, the calibration plane is located upstream of the device under test. For instance, the calibration plane is located at a connector of the device under test. The respective calibration plane is provided at an interface of the device under test, wherein the analyzer is connected with this interface, for example a cable connecting the device under test and the analyzer.

In other words, the calibrations can be applied on the measurements of the respective signals. The position of the amplitudes and phases can be determined accordingly, for instance at an end of a respective cable used to connect the device under test.

Another aspect provides that a de-embedding is performed by removing the contribution of a fully characterized component of the device under test and/or the analyzer. Moreover, an embedding may be performed by adding the contribution of a fully characterized component of the device under test and/or the analyzer. The de-embedding and/or embedding may be done when measuring the respective transmitted signal and the respective reflected signal. In some embodiments, the position of the defined amplitudes and/or phases can be shifted appropriately by the de-embedding or embedding. This might be useful if the actual device under test is mounted in an additional frame (for testing) or used in an additional frame (in real operation).

In some embodiments, the analyzer may be established by a vector network analyzer.

Generally, the compensation parameters of the respective signal source are obtained in a process in which the respective signal is generated of the corresponding signal source, namely the first one or the second one. The respective signal is generated by taking initial values into account.

Then, the respective transmitted signal as well as the response phase and the response amplitude are measured, namely the respective signal reflected from the device under test.

Then, the differences, for instance by port mismatch, are determined, which can be used for correction or rather compensation. The differences might already be used to determine the respective compensation parameters.

However, the differences may also be used to tune the respective signal source to the (newly determined) desired values. The (newly determined) desired values are based on the initial values and the differences determined. Accordingly, the determination of the respective compensation parameters may be an iterative procedure.

At the end of this (iterative) procedure, the respective compensation parameters are obtained, which are used to set the respective signal source accordingly.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
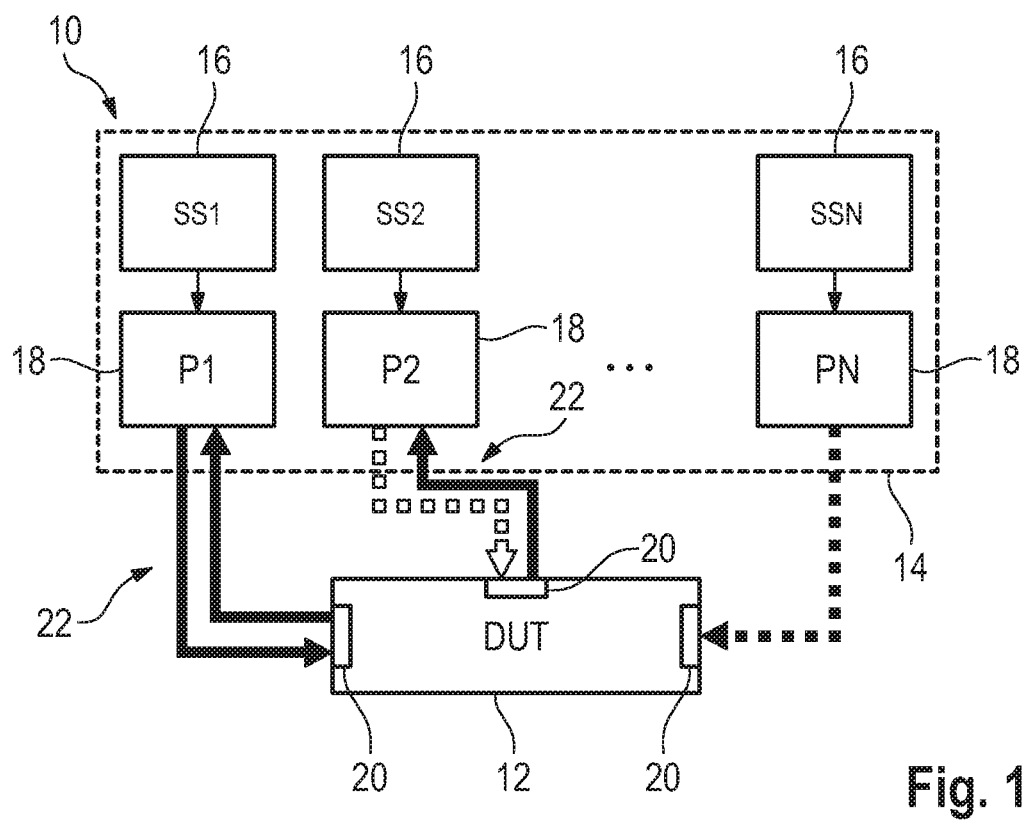
FIG. 1 schematically shows an overview of a representative test system used to perform a representative method of setting an analyzer according to an embodiment of the present disclosure in a first state.
Figure 2:
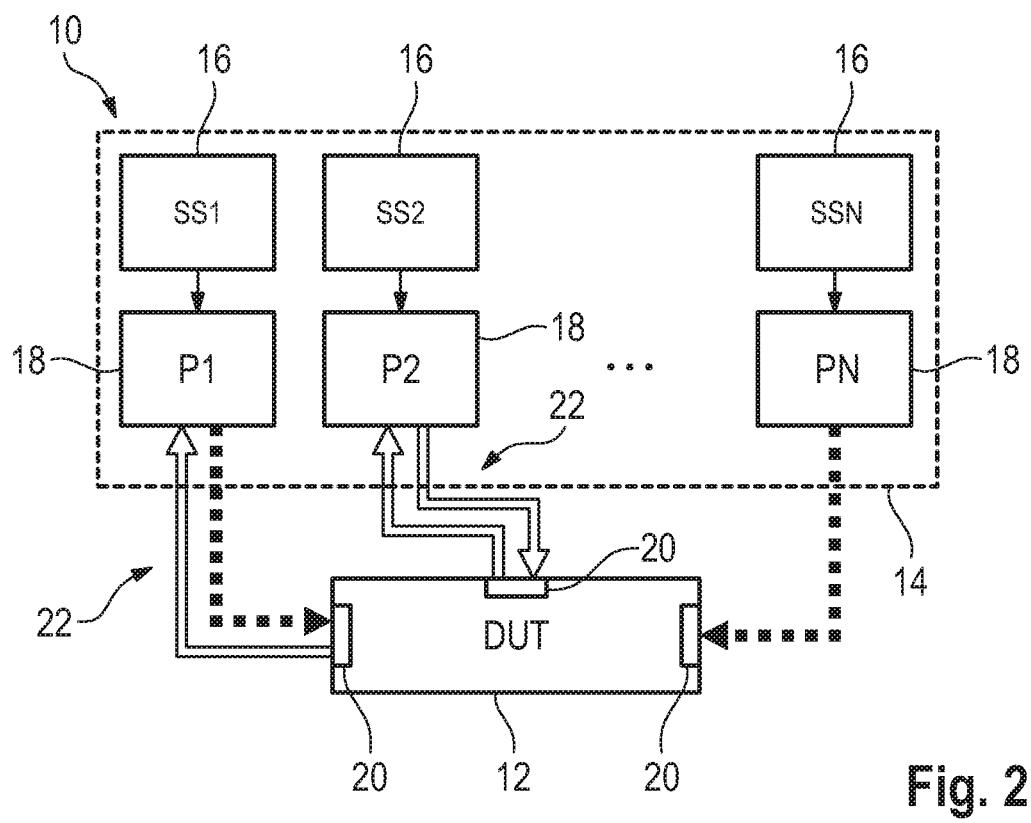
FIG. 2 schematically shows an overview of the test system used to perform a representative method of setting an analyzer according to an embodiment of the present disclosure in a second state.
Figure 3:
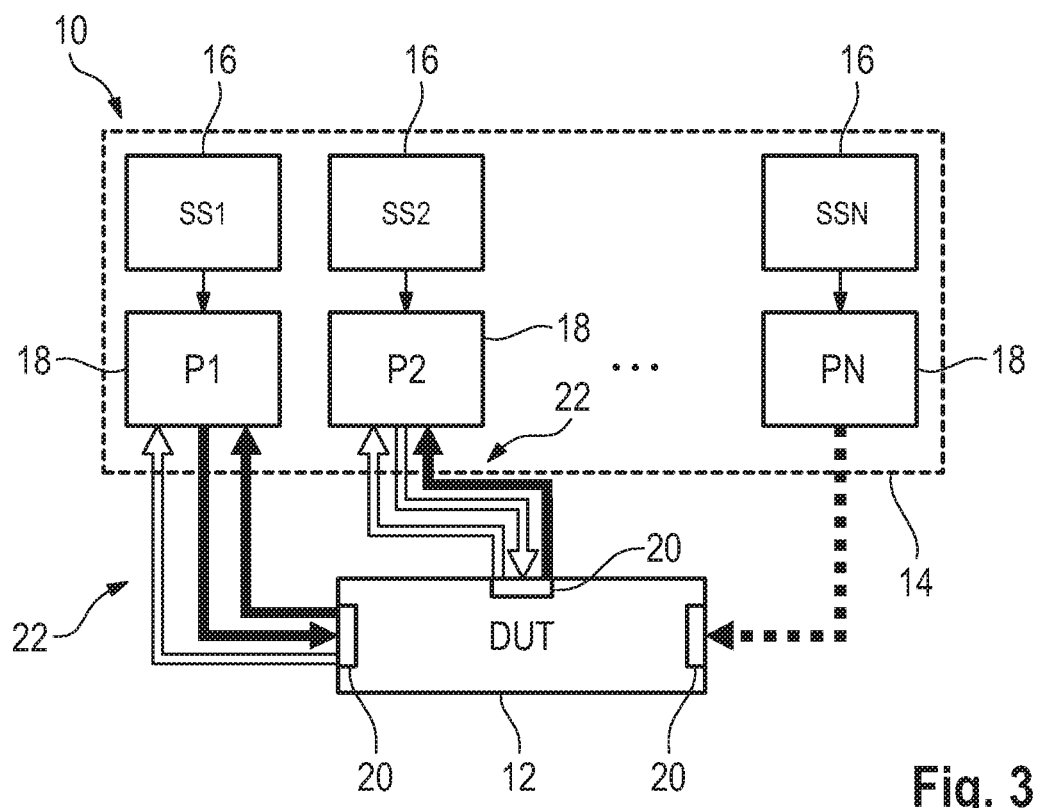
FIG. 3 schematically shows an overview of the test system used to perform a representative method of setting an analyzer according to an embodiment of the present disclosure in a third state.

FIGS. 1 to 3 show a test system 10 that is used to test a device under test 12 by an analyzer 14 in three different stages. However, the respective test setup of the test system 10 is the same, as the analyzer 14 is controlled differently in the three stages.

Generally, the analyzer 14 comprises several signal sources 16 that are assigned to corresponding ports 18 of the analyzer 14. In the shown embodiment, N signal sources 16 as well as N respective ports 18 are provided that might be connected with the device under test 12.

In any case, at least two of the signal sources 16 are connected with the device under test 12 via their respective ports 18. In some embodiments, the first signal source 16 as well as the second signal source 16, namely the ones labeled with SS1 and SS2, are connected via their respective ports 18, namely the ones labeled with P1 and P2, with the device under test 12, as illustrated in FIG. 1.

The ports 18 of the signal analyzer 14 may be connected with respective ports 20 of the device under test 12, wherein cables 22 are used to interconnect the respective ports 18, 20 of the device under test 12 and the signal analyzer 14, respectively.

In an embodiment, the analyzer 14 may be established by a vector network analyzer (VNA).

Figure 4:
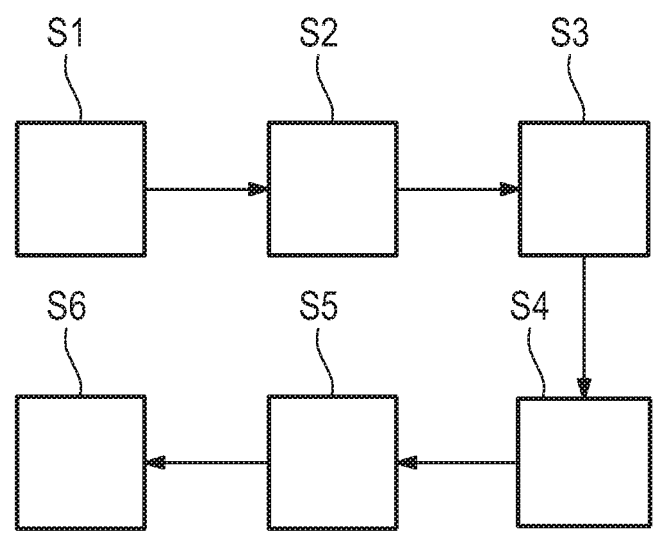
FIG. 4 shows a flow-chart illustrating a representative method of setting an analyzer for testing a device under test according to an embodiment of the present disclosure.

In general, the test system 10 is configured to perform a method as illustrated in the embodiment of FIG. 4 to which reference is made hereinafter as well.

In a first step S1, the analyzer 14 is provided that comprises the several signal sources 16. Each signal source 16 can be set in absolute phase and absolute amplitude.

In a second step S2, the signal sources 16 are connected with the device under test 12 via their respective ports 18, 20 as well as the interconnecting cables 22.

Thus, the setup of the test system 10 is established as shown in FIG. 1.

In a third step S3, a first signal is generated by the first signal source 16, namely the one labeled with SS1. The first signal is transmitted to the device under test 12 via the first port 18, namely the one labeled with P1. The analyzer 14 measures the first transmitted signal in amplitude and phase as well as a first signal reflected from the device under test 12 in amplitude and phase. In other words, the first transmitted signal and the first signal reflected from the device under test 12, for example at the respective input port of the device under test 12 are measured in amplitude and phase. The analyzer 14 performing the respective measurements further uses the measurement results in order to determine first compensation parameters for the first signal source 16. The first compensation parameters are used to compensate a port mismatch.

Accordingly, a first pre-measurement is performed in step S3, which uses only the first signal source 16 for transmitting a respective signal to the device under test 12 while the other signal sources 16 are connected with the device under test 12. Hence, a certain portion of the first signal runs through the device under test 12 to the second port 18, namely the one labeled with "P2", wherein a certain reflected signal from the second port 18 may be forwarded to the device under test 12, as indicated in FIG. 1 by the respective lines.

In a fourth step S4, a second signal is generated by the second signal source 16, namely the one labeled with SS2. The second signal is transmitted to the device under test 12 via the second port 18, namely the one labeled with P2. The analyzer 14 measures the second transmitted signal in amplitude and phase as well as a second signal reflected from the device under test 12 in amplitude and phase. In other words, the second transmitted signal and the second signal reflected from the device under test 12, for example at the respective input port of the device under test 12 are measured in amplitude and phase. The analyzer 14 performing the respective measurements further uses the measurement results in order to determine second compensation parameters for the second signal source 16. The second compensation parameters are used to compensate a port mismatch.

Accordingly, a second pre-measurement is performed in step S4, which uses only the second signal source 16 for transmitting a respective signal to the device under test 12 while the other signal sources 16 are connected with the device under test 12. Hence, a certain portion of the second signal runs through the device under test 12 to the first port 18, namely the one labeled with "P1", wherein a certain reflected signal from the first port 18 may be forwarded to the device under test 12, as indicated in FIG. 2 by the respective lines. Hence, the step S4 concerns the second state that is illustrated in FIG. 2.

Both pre-measurements provide the respective values with regard to phase and/or amplitude in order to correct the signal sources 16 for an accurate phase and/or amplitude, namely an absolute phase and/or an absolute amplitude, respectively.

In a fifth step S5, the first compensation parameters and the second compensation parameters are used to compensate the signal sources 16 with regard to absolute phase and/or absolute amplitude. The respective signal sources 16 are corrected appropriately in order to compensate for any influences of the signal path between the signal sources 16 and the device under test 12, for example any port mismatch.

In general, the respective pre-measurements performed in steps S3 and S4 may be performed in an iterative procedure.

This procedure, in some embodiments, may be done as follows:

First, the respective signal is generated by the corresponding signal source 16, namely the first one or the second one. The respective signal is generated by taking initial values into account. Hence, the respective signal has a given phase and a given amplitude.

Second, the respective transmitted signal as well as the response phase and the response amplitude, namely the respective signal reflected from the device under test 12, are measured by the analyzer 14.

The differences, for instance by port mismatch, are determined, which can be used for correction or rather compensation already. In other words, the differences might already relate to the respective compensation parameters.

However, the differences may also be used to tune the respective signal source 16 to (newly determined) desired values. The (newly determined) desired values are applied to generate the respective signal in amended form.

In some embodiments, the (newly determined) desired values are based on the initial values and the differences determined previously.

Therefore, the determination of the respective compensation parameters may be an iterative procedure. At the end of this (iterative) procedure, the respective compensation parameters are obtained, which are used to set the respective signal source 16 appropriately in the fifth step S5 as mentioned above.

In a sixth step S6, the first signal and the second signal are transmitted by the first signal source 16, labeled with SS1, associated with the first port 18, labeled with P1, and the second signal source 16, labeled with SS2, associated with the second port 18, labeled with P2, respectively. These signals are transmitted simultaneously after the compensation parameters obtained have been used to correct the signal sources 16 with regard to absolute phase and/or absolute amplitude.

This is shown in FIG. 3 that illustrates the third state. Comparing FIGS. 1 to 3, it becomes already obvious that the compensation parameters determined during the pre-measurements correctly considers the third state shown in FIG. 3.

During the pre-measurements, in which only one signal source 16 is actively used for transmitting the respective signal to the device under test 12, the other signal source 16 is still connected with the device under test 12 such that a certain portion of the respective signal transmitted is received by the port associated with the signal source that does not actively transmit a signal. This is indicated in FIGS. 1 and 2 respectively.

This specific signal transmission (and reflection associated therewith) is taken into account when determining the compensation parameters for the respective signal source 16 in steps S3 or S4 according to the states shown in FIGS. 1 and 2.

For instance, the power of the signal source 16 that does not actively transmit a signal is reduced when the other signal source 16 transmits its respective signal. This ensures that only one signal source 16 is actively transmitting a signal during the respective measurements. However, the respective signal source that does not actively transmit a signal may be active, but attenuated such that no signal is transmitted by the signal source 16 attenuated.

As already mentioned above, the respective pre-measurements are performed for all signal sources 16 that shall be involved in a respective simultaneous transmission of several signals, namely the third state shown in FIG. 3.

After all signal sources 16 involved in the simultaneous transmission have been pre-measured appropriately in order to determine the respective compensation parameters, the signal sources 16 are switched on together in order to actively transmit their respective signals for the desired measurement of the device under test 12.

As indicated above, this method can be used with any number of signal sources 16, as the pre-measurements are performed for each signal source 16 individually in order to obtain the respective compensation parameters for the respective signal source 16.

Once the respective compensation parameters were obtained for all signal sources 16 to be involved in the simultaneous transmission, all signal sources 16 transmit their respective signals simultaneously.

Further, an amplitude calibration and/or phase calibration may be performed at a calibration plane that may be located upstream of the device under test 12, for instance at a connector of the device under test 12 that is used to connect the device under test 12 with the analyzer 14. The respective calibration(s) may be done during the pre-measurements.

In addition, a de-embedding and/or an embedding may be performed by removing or rather adding a certain contribution of a fully characterized component of the device under test 12 or the analyzer 14. Thus, the position of the calibration plane can be shifted appropriately.

Furthermore, the respective signals and wave propagate along the respective cables 22 that are used to interconnect the device under test 12 with the analyzer 14.

Figure 5:
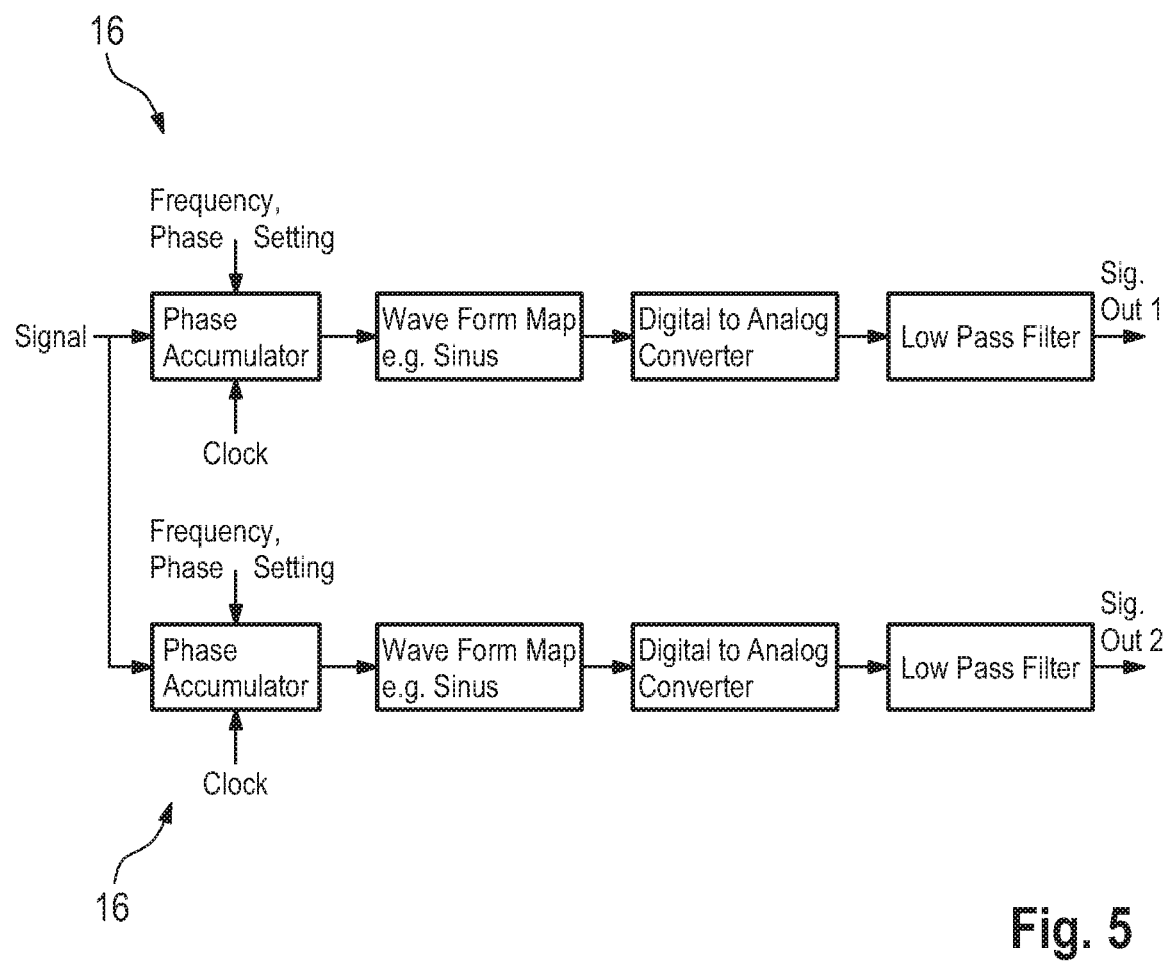
FIG. 5 shows an exemplary overview of signal sources used by the test system.

The signal sources 16 are synchronized in time with respect to each other. This can be achieved by the arrangement as shown in FIG. 5, for example the phase accumulators shown in FIG. 5.

Accordingly, the respective signal sources 16, for example direct digital synthesizers (DDS) assigned thereto, are started at exactly the same time. Thus, all signal sources 16 or rather the respective direct digital synthesizers start working at the exact same time, which causes them to generate respective signals with the same phase at any time.

Any differences in phase result from the respective signal paths between the signal sources 16 and the device under test 12, which however are compensated by the compensation parameters determined previously.

In general, the method according to the present disclosure ensures that the signal sources 16 of the analyzer 14 can be precisely defined in amplitude and phase, as the absolute phase and the absolute amplitude may be ensured. Therefore, the absolute phase and the absolute amplitude can be set in order to ensure generation of several signals with precisely defined amplitude and phase.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method of setting an analyzer for testing a device under test, said method comprising:
   providing an analyzer with at least a first signal source and a second signal source, the first signal source being different than the second signal source, each signal source being capable of being set in at least one of absolute phase and absolute amplitude;
   connecting said first and second signal sources with a device under test;
   generating a first signal by said first signal source, transmitting said first signal to said device under test, measuring said first transmitted signal in amplitude and phase and a first signal reflected from said device under test in amplitude and phase, thereby obtaining first compensation parameters for said first signal source;
   generating a second signal by said second signal source, transmitting said second signal to said device under test, measuring said second transmitted signal in amplitude and phase and a second signal reflected from said device under test in amplitude and phase, thereby obtaining second compensation parameters for said second signal source;
   using said first compensation parameters and said second compensation parameters to compensate said signal sources with regard to at least one of absolute phase and absolute amplitude; and
   transmitting said first signal by said first signal source and said second signal by said second signal source simultaneously.

2. The method according to claim 1, wherein settings of said signal sources are adjusted while connected to said device under test to compensate a port mismatch.

3. The method according to claim 1, wherein said signal sources transmit their respective signals at the same frequency.

4. The method according to claim 1, wherein said signal sources are synchronized in time with respect to each other.

5. The method according to claim 1, wherein said second signal source is connected with said device under test when said first signal source transmits said first signal and/or wherein said first signal source is connected with said device under test when said second signal source transmits said second signal.

6. The method according to claim 1, wherein said second signal is reduced in power when said first signal source transmits said first signal and/or wherein said first signal is reduced in power when said second signal source transmits said second signal.

7. The method according to claim 1, wherein said second signal source is active, but attenuated when said first signal is generated and transmitted by said first signal source and/or wherein said first signal source is active, but attenuated when said second signal is generated and transmitted by said second signal source.

8. The method according to claim 1, wherein at least one of said absolute phase and said absolute amplitude is independent of an isolation of said device under test.

9. The method according to claim 1, wherein said analyzer comprises three or more signal sources, each of said signal sources transmitting a respective signal to said device under test, wherein said respective transmitted signal is measured in amplitude and phase and a respective signal reflected from said device under test is measured in amplitude and phase, thereby obtaining respective compensation parameters for said respective signal source.

10. The method according to claim 1, wherein all signal sources transmit their respective signals simultaneously after respective compensation parameters were obtained for all signal sources involved in said simultaneous transmission.

11. The method according to claim 1, wherein at least one of an amplitude calibration and a phase calibration is performed at a calibration plane.

12. The method according to claim 11, wherein said calibration plane is located upstream of said device under test.

13. The method according to claim 11, wherein said calibration plane is located at a connector of said device under test.

14. The method according to claim 1, wherein a de-embedding is performed by removing a contribution of a fully characterized component of at least one of said device under test or said analyzer.

15. The method according to claim 1, wherein an embedding is performed by adding a contribution of a fully characterized component of at least one of said device under test or said analyzer.

16. The method according to claim 1, wherein said analyzer is a vector network analyzer.

17. The method according to claim 9, wherein all signal sources transmit their respective signals simultaneously after respective compensation parameters were obtained for all signal sources involved in said simultaneous transmission.

18. The method according to claim 9, wherein at least one of an amplitude calibration and a phase calibration is performed at a calibration plane.

19. The method according to claim 18, wherein said calibration plane is located upstream of said device under test.

20. The method according to claim 18, wherein said calibration plane is located at a connector of said device under test.

21. The method according to claim 9, wherein a de-embedding is performed by removing a contribution of a fully characterized component of at least one of said device under test or said analyzer.

22. The method according to claim 9, wherein an embedding is performed by adding a contribution of a fully characterized component of at least one of said device under test or said analyzer.

23. The method according to claim 9, wherein said analyzer is a vector network analyzer.

* * * * *